United States Patent [19]

Conroy-Wass et al.

[11] Patent Number: 5,248,261
[45] Date of Patent: Sep. 28, 1993

[54] DOUBLE ENDED HERMAPHRODITIC SIGNAL NODE MODULE

[75] Inventors: Theodore R. Conroy-Wass, Tustin; Willis A. Williams, Anaheim, both of Calif.

[73] Assignee: Hughes Aircraft Company, Los Angeles, Calif.

[21] Appl. No.: 922,909

[22] Filed: Jul. 31, 1992

[51] Int. Cl.⁵ .............................................. H01R 9/09
[52] U.S. Cl. ..................................... 439/65; 439/67; 439/77; 439/295; 439/493; 439/91
[58] Field of Search .................. 439/65, 67, 77, 79, 439/91, 284, 286, 289, 295, 329, 492, 493, 497, 499

[56] References Cited

U.S. PATENT DOCUMENTS

| | | | |
|---|---|---|---|
| 3,065,446 | 11/1962 | Robb et al. | 439/295 |
| 4,871,315 | 10/1989 | Noschese | 439/67 |
| 4,934,942 | 6/1990 | Casciotti | 439/67 |
| 4,950,171 | 8/1990 | Muzslay | 439/77 |
| 5,199,881 | 4/1993 | Oshita et al. | 439/65 |

*Primary Examiner*—Paula A. Bradley
*Attorney, Agent, or Firm*—Elizabeth E. Leitereg; Terje Gudmestad; Wanda K. Denson-Low

[57] ABSTRACT

An hermaphroditic electrical connector (10) is provided for interconnecting printed circuit boards (69) which includes a housing (11) of dielectric material and two pressure tables (28, 35) which are biased outwardly by springs (30, 34) in directions perpendicular to each other. Each pressure table (28, 35) includes a flat surface (48, 51) over which is a resilient pad (47, 50). A flexible circuit (46) has contact arrays (56, 59) over the flat surfaces (48, 51) and pads (47, 50) with conductors (57) in the intermediate portion that extends through the housing (11). A grounding clip (61) may be provided with the forward pressure table to give 360 degree shielding.

15 Claims, 10 Drawing Sheets

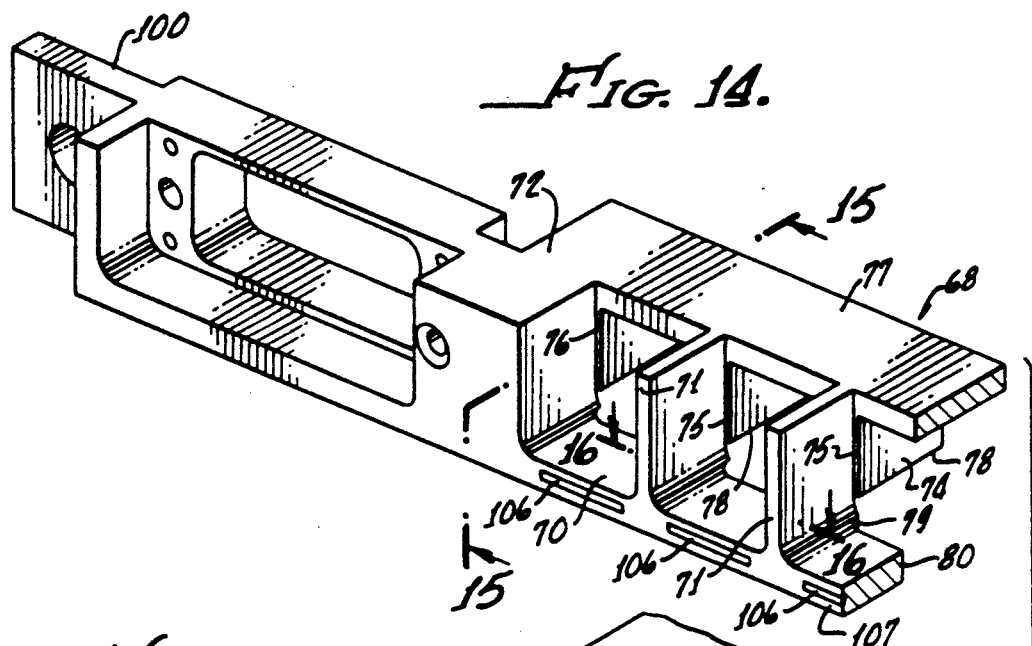
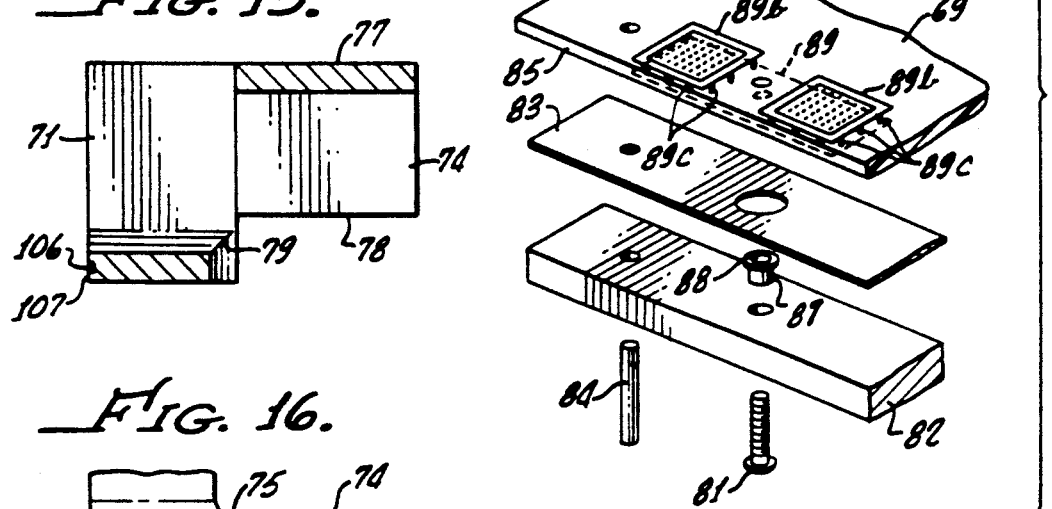
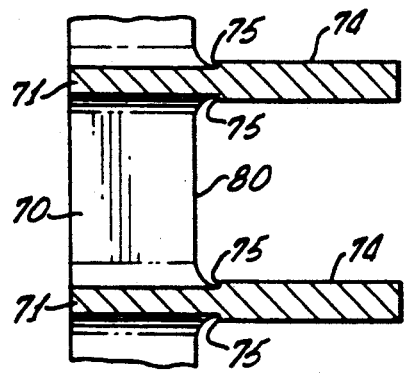
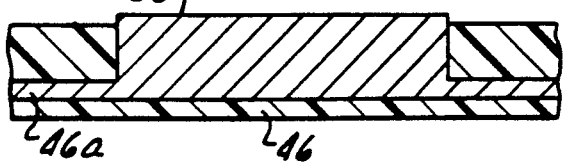

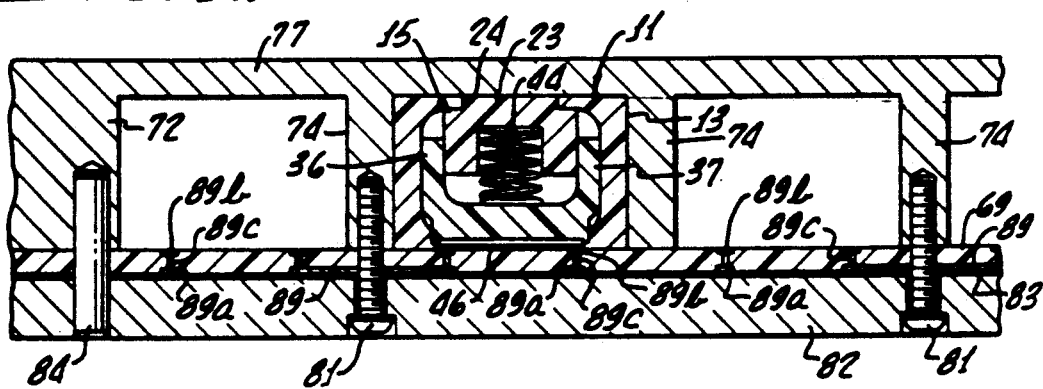
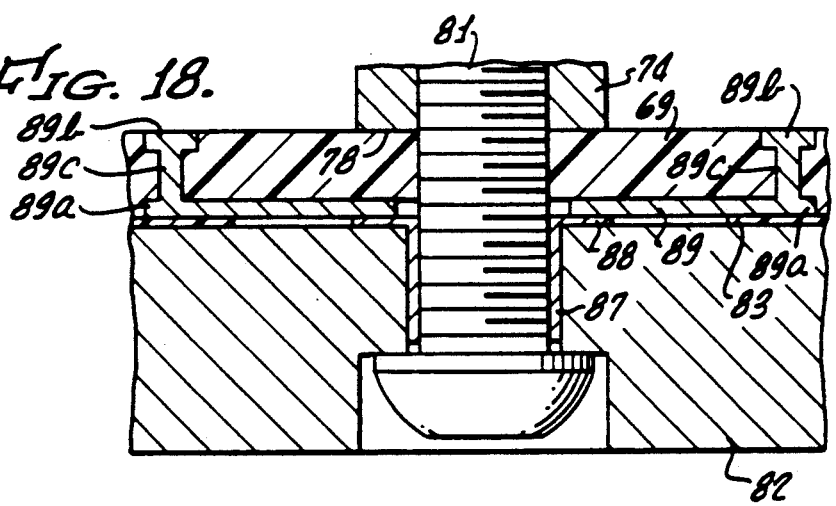
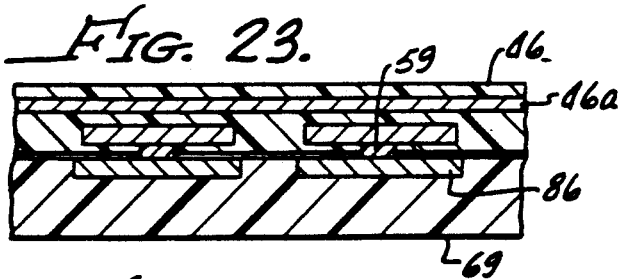
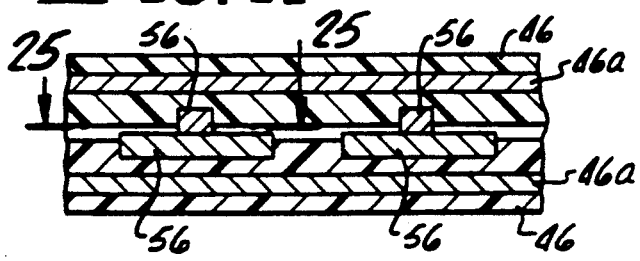
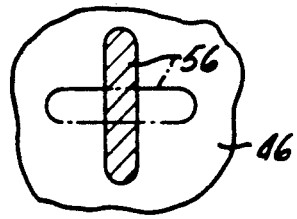

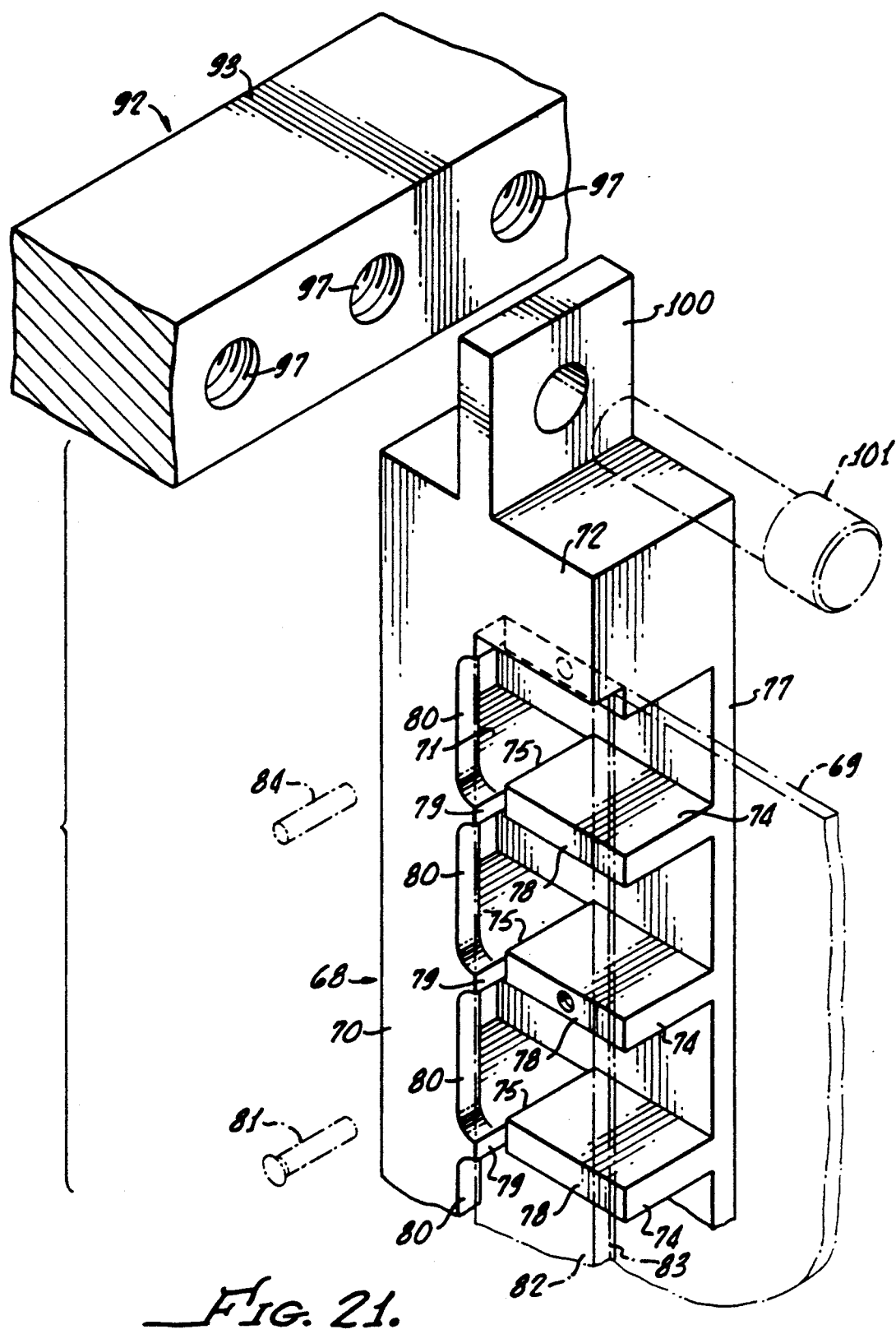
_FIG. 21._

DOUBLE ENDED HERMAPHRODITIC SIGNAL NODE MODULE

BACKGROUND OF THE INVENTION

1. Field of the Invention

This invention relates to electrical connectors, and in particular to a connector for interconnecting printed circuit boards.

2. Description of Related Art

In computers and other electronic devices, electrical connections may become necessary among large numbers of printed circuit boards. Conventionally this has required the inclusion of transitional printed circuit boards which are positioned between and connect to two groups of printed circuit boards. The transitional board serves to make the electrical connections among the various printed circuit boards thus grouped. This obviously is disadvantageous by requiring an extra printed circuit board which is electrically connected by conventional connecting means. Alternatively, jumper cables or backplanes with jumper cabling are employed with conventional pin-and-socket interconnection terminal devices. These arrangements require complex and costly termination processes and hardware and result in impedance circuits of varying lengths. This causes varying impedance and timing so that it may be necessary in some cases to introduce compensating timing circuits that account for differences in the time required for signals to traverse different ones of the circuit paths that interconnect the boards.

An improvement in this arrangement is set out in patent application Ser. No. 801,977, filed Dec. 3, 1991 now U.S. Pat. No. 5,199,881, by Felix M. Oshita, Ronald L. Campbell and Theodore R. Conroy-Wass, for HERMAPHRODITIC INTERCONNECTION OF CIRCUIT BOARDS. This application has the same assignee as the present application and is incorporated herein by reference. In the earlier design hermaphroditic connectors are provided along the edges of circuit boards to be interconnected and are pressed together at their forward faces where contacts are brought into interengagement. This eliminates the need for transitional printed circuit boards or jumper cabling. Conventional pin-and-socket connectors with their attendant disadvantages are eliminated. Nevertheless there is room for improvement in this prior design and the present invention offers distinct advantages over this earlier design.

SUMMARY OF THE INVENTION

The present invention provides an hermaphroditic node module which includes a flexible circuit having two arrays of exposed contacts in planes at 90 degrees to each other. Each of these portions of the flexible circuit is mounted on a pressure table which is biased outwardly of a connector body by means of one or more compression springs. The pressure table for the forward face of the connector that mates with an identical connector has freedom for limited floating movement to help assure proper interengagement of the mating sets of contacts. A resilient pad on the outer face of the pressure table distributes the mating force equally and compensates for minor variations in surface contour.

The pressure table for the other array of contacts is confined to a rectilinear path of movement, inasmuch as it is to be connected to a flat printed circuit board. Again a resilient pad is employed beneath the contact array.

The pressure table for the mating face of the connector includes forwardly projecting side flanges the edges of which are to engage the flange edges of an identical connector to assist in the alignment and positioning of the two connectors. Optionally, a grounding clip may be included, extending around the forward pressure table and provided with forwardly projecting tabs which engage the grounding clip of the mating connector. The grounding clip connects to the grounding plane of the flexible circuit through the brass rivets that retain the flexible circuit to the pressure table. Grounding contacts on the flexible circuit provide additional shielding. In this manner, 360 degree shielding can be achieved.

The conductors that interconnect the two sets of contacts of the flexible circuit are all of the same length. Therefore the circuit paths and the impedance are the same for all interconnected contacts. A ground plane layer is provided on the entire underside of the flexible circuit.

The connector is compact, self-aligning, requires zero insertion force at the interfaces, and has no pin-and-socket contacts with attendant wear and contact forces, as well as associated hardware. Higher density and greater interfacial positional zone tolerance for interconnections are achieved. It can interconnect in single pairs or in multiple arrays. The connector is superior to the earlier hermaphroditic connector referred to above by assuring more uniform contact pressure, self-alignment at the mating face, and permitting a higher force biasing the mating connectors together. A much higher contact density is made possible. It is also easier to assemble, is made largely of lightweight durable plastic parts, and is readily mounted in a carrier for supporting the connector. Unlike the earlier connector, the present invention provides fully shielded circuits with matching impedance of 50 ohms. The earlier design also lacks the grounding clip of the present invention.

BRIEF DESCRIPTION OF THE DRAWINGS

FIG. 13 is an enlarged sectional view of the flexible circuit showing the connection of the grounding contact stripes to the grounding plane;

FIG. 14 is a fragmentary exploded perspective view of the carrier for the connectors and the arrangement for attaching a circuit board to it;

FIG. 15 is a transverse sectional view taken along line 15—15 of FIG. 14;

FIG. 16 is a fragmentary sectional view taken along line 16—16 of FIG. 14;

FIG. 17 is a longitudinal sectional view illustrating the attachment of the carrier to a printed circuit board;

FIG. 18 is an enlarged fragmentary sectional view showing the ground connection at a printed circuit board;

FIG. 21 is an enlarged exploded perspective view illustrating the carrier and its manner of attachment to the midplane frame;

FIG. 23 is an enlarged fragmentary view showing the interconnection of the contacts of the flexible circuit on the connector with the contact pads of a printed circuit board;

FIG. 24 is an enlarged fragmentary sectional view showing the interengagement of the contacts at the forward ends of two mating connectors; and FIG. 25 is a sectional view taken along line 25—25 of FIG. 24.

DESCRIPTION OF THE PREFERRED EMBODIMENTS

Figure 1:
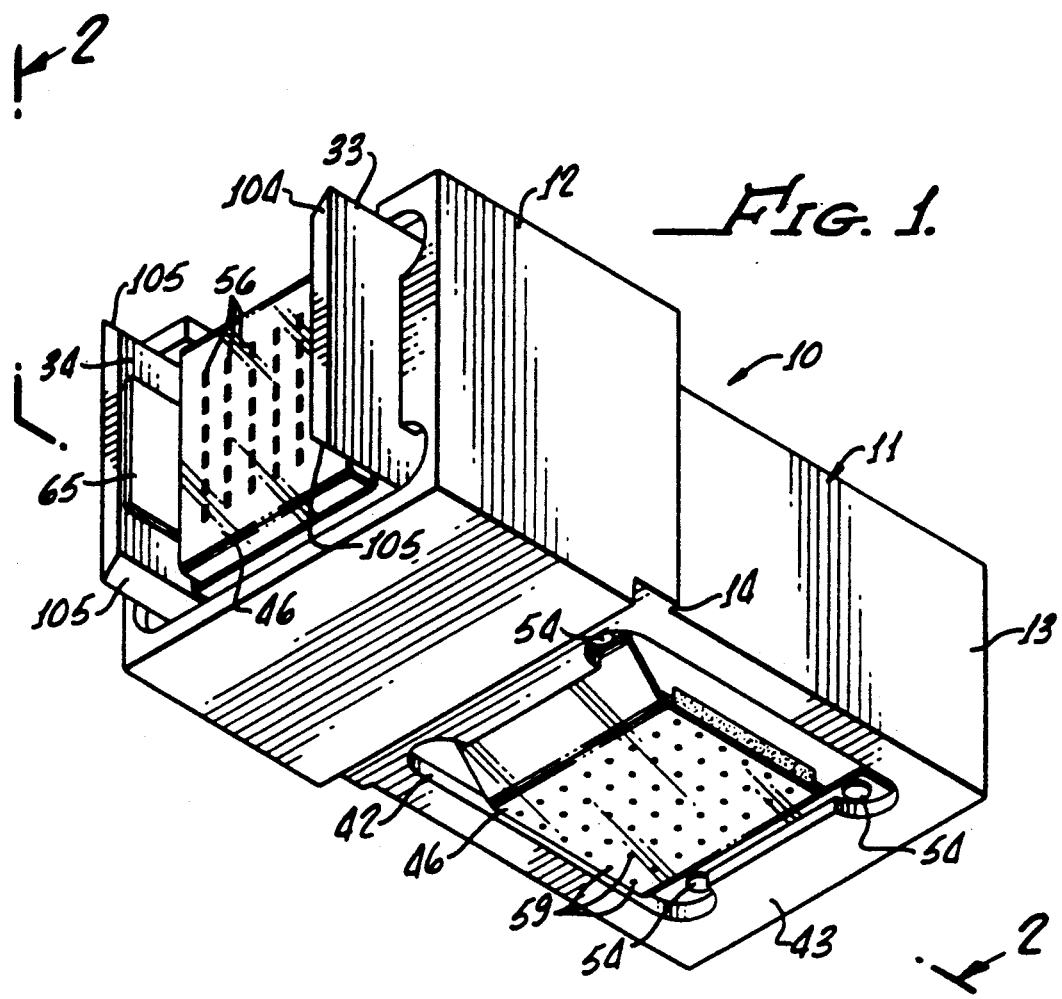
FIG. 1 is a perspective view of an electrical connector.

The connector 10 for interconnecting printed circuit boards includes a hollow housing 11 of dielectric material which includes a forward section 12 and a rearward section 13. Both the forward and rearward sections are rectangular in cross section, but the forward section 12 is of larger lateral dimension than that of the rearward section 13. This provides an external shoulder 14 on both sides and at the top between the forward and rearward sections 12 and 13.

Within the housing 11 is a body 15 which has a forward portion 16 received in the forward part 12 of the housing 11 and a rearward portion 17 that is received within the rearward portion 13 of the housing 11. The rearward end of the body 15 terminates in a flat generally rectangular transverse disk 18 positioned at the open rearward end of the housing 11. A tab 19 projecting from the upper edge of the disk portion 18 is received in a notch 20 at the rearward end of the upper wall 21 of the rearward portion 13 of the housing 11. This prevents the member 15 from moving forwardly relative to the housing 11.

A flat ridge 23 on the upper surface of the rearward portion 17 of the body 15 is complementarily received in an elongated slot 24 through the upper wall 21 of the housing 11. The rearward edge of the ridge 23 engages the rearward edge of the slot 24 which prevents the body 15 from moving rearwardly relative to the housing 11.

Figure 4:
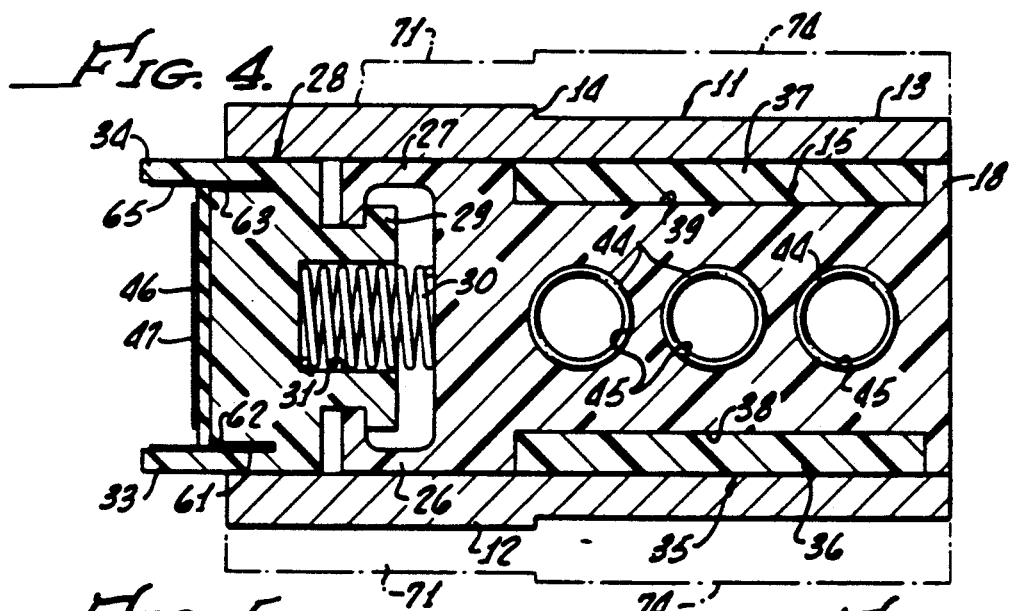
FIG. 4 is a longitudinal sectional view taken along line 4—4 of FIG. 2.
Figure 7:
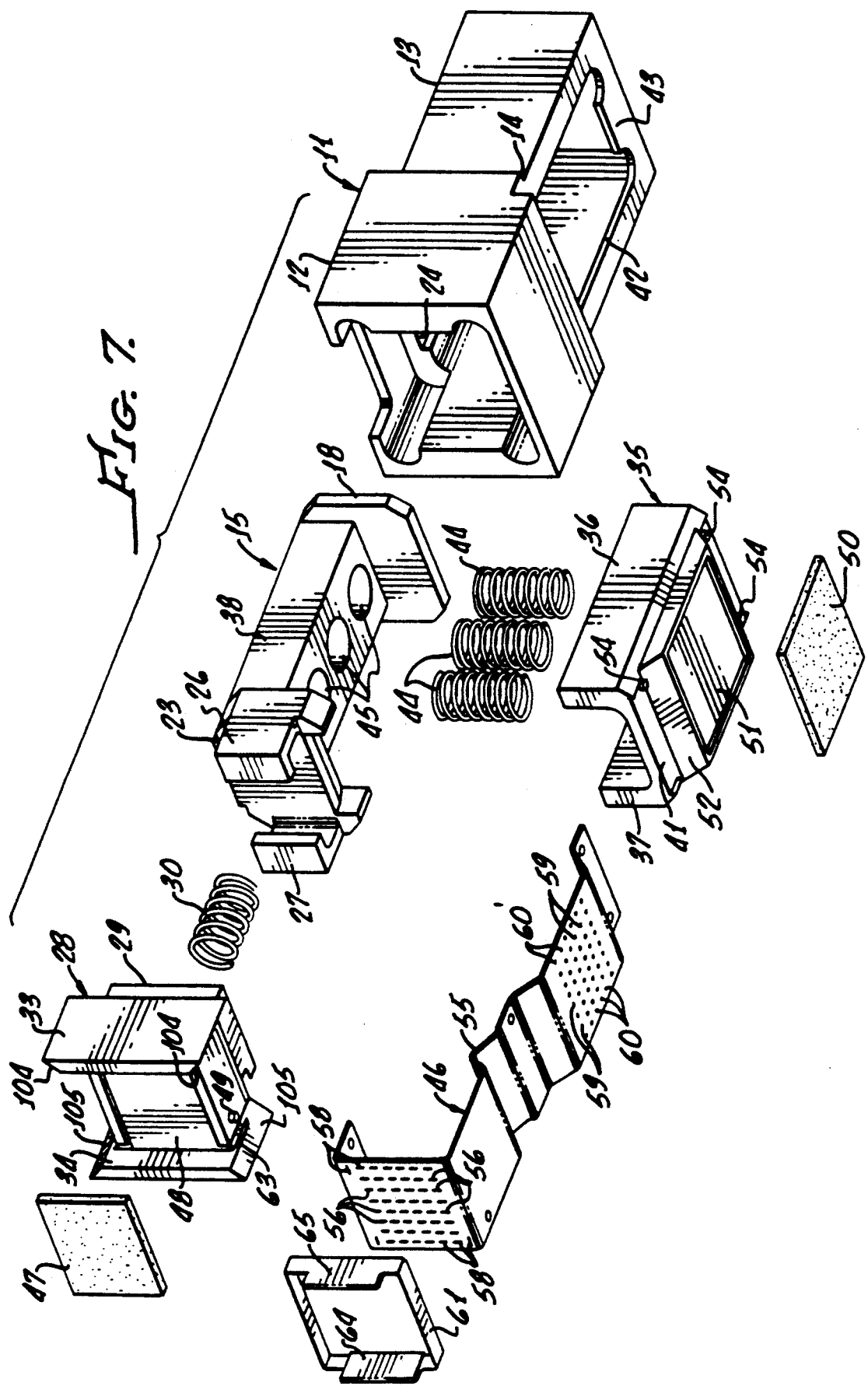
FIG. 7 is an exploded perspective view of the components of the connector as viewed generally from the front and the bottom.

At the forward end of the member 15 are two forwardly projecting L-shaped arms 26 and 27 that provide end flanges projecting toward each other (see FIGS. 4 and 7). A pressure table 28 of dielectric material is received in the open forward end 12 of the housing 11 and on either side includes a rearward flange 29 received between the arms 26 and 27 of the body 15. A compression spring 30 bears against the body 15 at one end and is received within a recess 31 in the rearward end of the pressure table 28 at its other end. This biases the pressure table 28 forwardly with respect to the housing 11 and the member 15, this movement being limited by the engagement of the flange 29 with the arms 26 and 27. The pressure table 28 has freedom for limited floating movement relative to the housing 11. Two parallel side flanges 33 and 34 extend from the forward end of the pressure table 28, projecting outwardly from the forward end of the housing 11.

Figure 5:
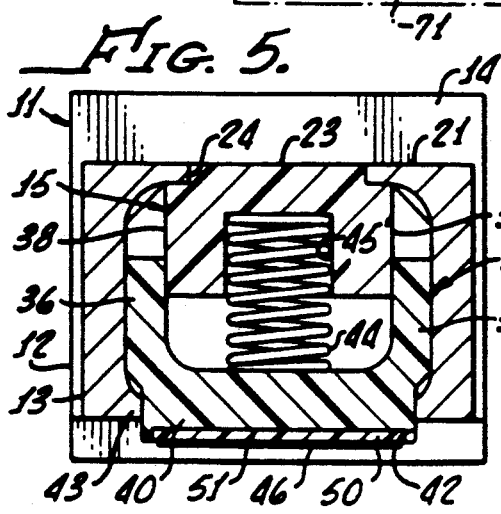
FIG. 5 is a transverse sectional view taken along line 5—5 of FIG. 2.
Figure 6:
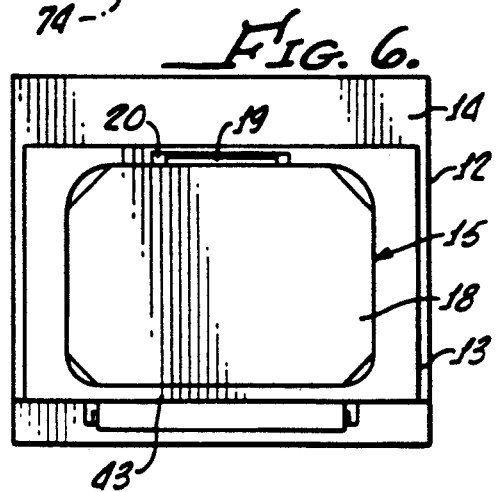
FIG. 6 is an end elevational view of the connector.
Figure 8:
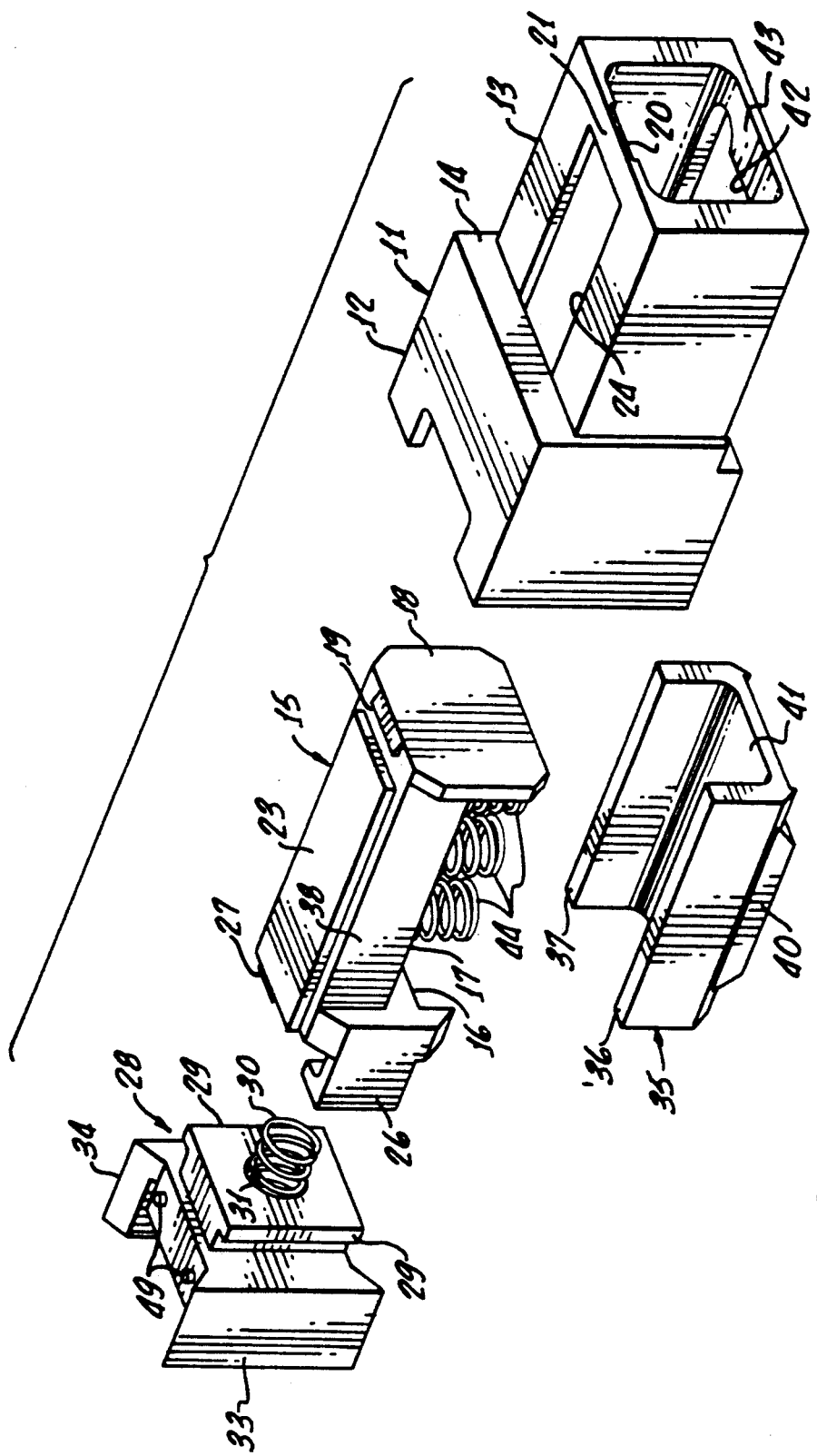
FIG. 8 is an exploded perspective view of the connector taken generally from above and to the rear.
Figure 9:
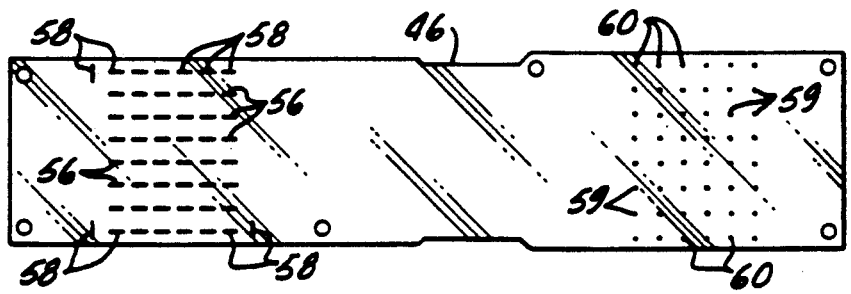
FIG. 9 is a plan view of the flexible circuit used in the connector, prior to the bending of the flexible circuit.

The rearward portion 13 of the housing 11 receives a second pressure table 35 which is generally U-shaped in cross section, as seen in FIGS. 5 and 8. The two side flanges 36 and 37 of the pressure table 35 fit around the opposite side edges 38 and 39 of the body 15 between the enlarged forward section 16 and the rearward disk 18. This holds the pressure table 35 against movement longitudinally of the body 15 and housing 11. The thickened central projecting portion 40 of the lower wall 41 of the pressure table 35 protrudes through an opening 42 in the bottom wall 43 of the rearward portion 13 of the housing 11. Three compression springs 44 bear against the upper surface of the wall 41 of the pressure table 35 and are received within recesses 45 in the intermediate portion of the member 15. This biases the pressure table 35 downwardly, as the device is illustrated, relative to the body 15 and the housing 11. The pressure table 35 is confined to a rectilinear path of movement relative to the housing 11 by the side flanges 36 and 37 that extend around the intermediate portion of the body 15 between the flanges 26 and 27, and the disk portion 18. This movement is perpendicular to the linear movement permitted the pressure table 28.

Figure 2:
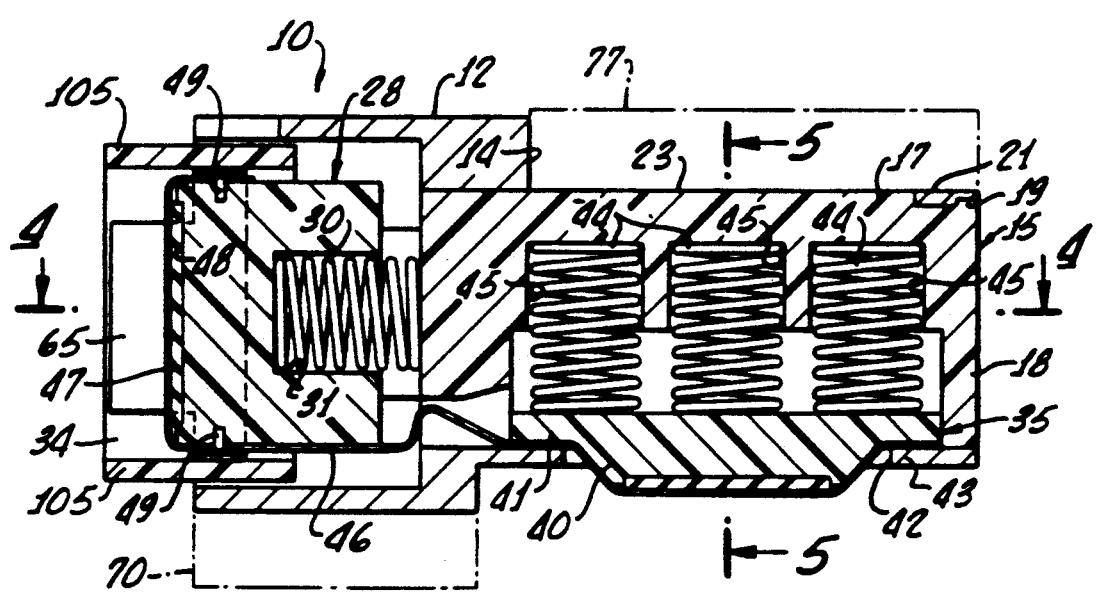
FIG. 2 is a longitudinal sectional view taken along line 2—2 of FIG. 1.
Figure 3:
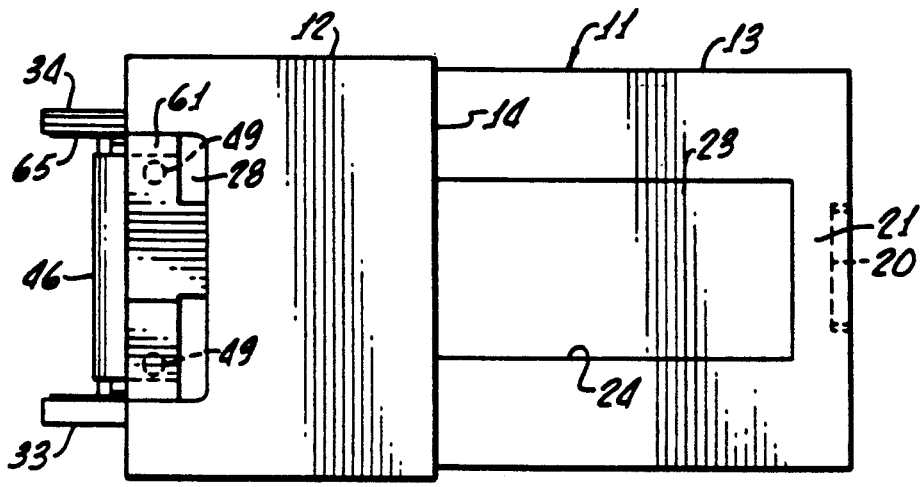
FIG. 3 is a top plan view of the connector.

A flexible circuit 46, contoured as shown in FIGS. 2 and 7, extends between the pressure tables 28 and 35. The flexible circuit 46 wraps around the pressure table 28, extending over a resilient pad 47 that is positioned over the flat recessed forward surface 48 of the pressure table 28. Rivets 49 extend from the pressure table 28 through openings in the flexible circuit 46 and their outer ends are upset. This holds the flexible circuit to the pressure table 28 and maintains it in a predetermined registry with the pressure table. If desired, some or all of the pins 49 may be made of metal and make contact with a grounding conductor in the flexible circuit.

The opposite end of the flexible circuit 46 extends over the central projecting portion 40 of the pressure table 35, across a resilient elastomeric pad 50 that fits over the flat recessed bottom surface 51. The flexible circuit extends over beveled surfaces 52 and 53 of the projecting portion 40 at its forward and rearward ends and is held in proper alignment by rivets 54.

A bend 55 in the flexible circuit 46 between its two ends provides an excess length to allow the pressure tables 28 and 35 to move a limited distance relative to the housing 11. The intermediate portion of the flexible circuit 46 between the two pressure tables is received within the housing 11.

Figure 10:
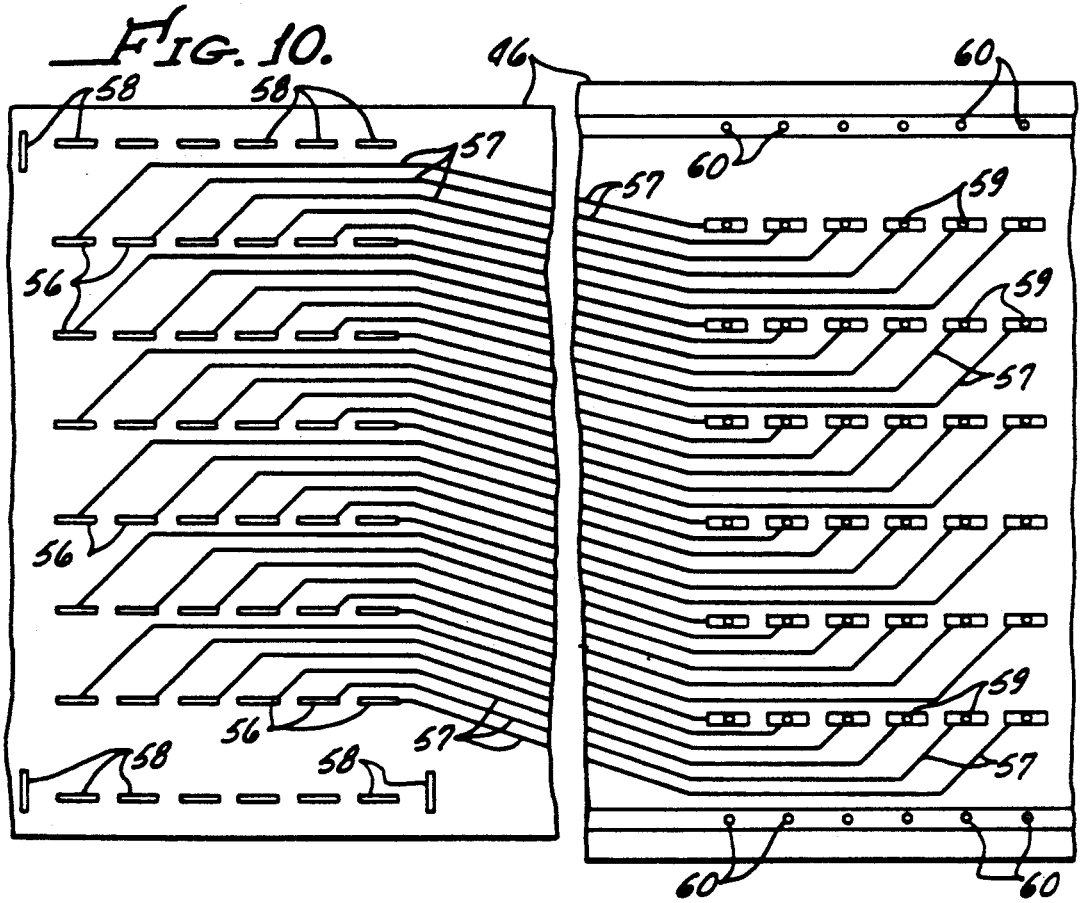
FIG. 10 is an enlarged fragmentary plan view of the flexible connector illustrating the interconnection of the contacts of the flexible circuit.
Figure 11:
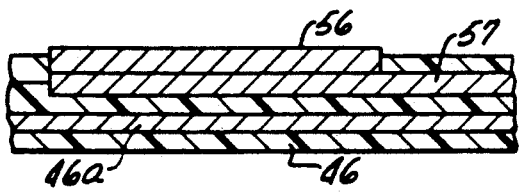
FIG. 11 is an enlarged sectional view showing the contact stripe at one end of the flexible circuit.
Figure 12:
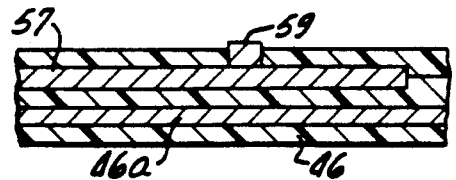
FIG. 12 is an enlarged sectional view showing the contact dot at the opposite end of the flexible circuit.

At the pressure table 28, the flexible circuit 46 provides an array of exposed parallel contact stripes 56 which project above the surface of the substrate of the circuit and are arranged in a closely spaced pattern, each connecting to a conductor 57 that is buried within the substrate (see FIGS. 10, 11 and 12). In a typical example, there are thirty-six of the contact stripes 56 at the member 28. There are, in addition, grounding contact stripes 58 which connect to the grounding plane 46a of the flexible circuit which extends along the entire length and width of the flexible circuit beneath the conductors 57 (FIG. 13).

The opposite end of the flexible circuit 46 includes either similar contact stripes or outwardly projecting contact dots 59. The conductors 57 interconnect the contact stripes 56 and the contact dots 59. The pattern of the conductors 57 is such that the distances between all connected contacts 56 and 59 is the same (see FIG. 10). The grounding contact dots 60 outside of the contact 59 are connected to the grounding plane of the flexible circuit.

The forward end of the connector 10 optionally may include a grounding clip 61, which has a rectangular sheet metal base portion received in slots 62 and 63 in the forward end of the pressure table 28. Opposite parallel forwardly projecting tabs 64 and 65 of the grounding clip are positioned along the inner sides of the flanges 33 and 34. The base of the grounding clip 61 makes contact with the rivets 49 that hold the flexible circuit 46 to the pressure table 28.

The connector 10 is hermaphroditic and can mate with an identical connector 10 at its forward end. Each of the mating connectors will be connected to a printed circuit board at its rearward end. A number of printed circuit boards can be interconnected by the arrangement shown in FIGS. 14–21.

One set of several of the connectors 10 is mounted in a carrier 68 which connects each connector 10 to contact pads of a single printed circuit board 69. The carrier 68 is an elongated member that includes a longitudinal base wall 70 and a series of equally spaced parallel forward transverse walls 71 which are perpendicular to the base wall. A thicker transverse wall 72 is at one end portion of the carrier 68. Beyond the wall 72 is a receptacle 73 which can receive an electrical connector, unlike the connector 10, which forms part of the circuit that supplies power to the printed circuit board attached to the carrier (FIG. 14). A similar wall 72 is provided at the opposite end of the carrier 68, but without a receptacle beyond it.

The transverse walls 71 extend to rearward transverse wall portions 74 of increased thickness. This results in shoulders 75 on either side of each wall 71 at the forward edge of the rearward portion 74. Similar shoulders 76 are defined at the transverse walls 72. The carrier 68, in addition, includes an upper wall 77 which extends the length of the unit parallel to the base wall 70 and over the rearward wall portions 74. The upper wall 77 is offset transversely relative to the base wall 70. Therefore, the carrier 68 defines a series of pockets or receptacles between the transverse walls 71 and between the transverse walls 73 which are open at their ends along either side of the carrier, and also open opposite from the walls 70 and 77.

The rearward transverse wall portions 74 are shorter than the forward transverse walls 71, terminating at bottom edges 78. The rearward edges 79 of the walls 71, below the bottom edges 78, extend into the rearward end of the longitudinal base wall 70. The rearward edge surface 80 of the wall 70 is recessed between adjacent edges.

One edge portion of the printed circuit board 69 is secured to the carrier 68 by means of screws 81 which extend through a clamping bar 82 and an insulator strip 83, as well as through the printed circuit board 69. The screws 81 are received within threaded openings in the rearward wall portions 74. Precise alignment of the components is accomplished by pins 84 which extend through the clamping bar 82, the insulator strip 83 and the printed circuit board 69 into the end walls 72 of the carrier 68. The printed circuit board 69 then engages the bottom edges 78 of the rearward transverse wall portions 74, and its edge 85 lies alongside the rearwardly facing edge 79 of the carrier 68.

The printed circuit board 68 includes signal pad arrays 86 spaced adjacent its edge 85 and positioned so that there is one such an array between adjacent wall portions 74, rearwardly of the longitudinal wall 70. A grounding field is produced by including grommets 87 around the screws 81, extending through the clamping bar 82, each with a head 88 at an opening in the insulator strip 83. A grounding plane 89 is exposed on the underside of the printed circuit board 69 and engaged by the grommet head 88. The ground conductor 89 includes openings 89a at its opposite ends so that it extends around two adjacent contact arrays 86. Each adjacent pair of contact arrays 86 is provided with a grounding field in this manner. The grounding plane 89 includes two frame portions 89b that extend around the paired contact arrays 86 on the upper side of the printed circuit board 69 and are connected to the lower portion by conductors 89c. The grounding contact dots 60 of the flexible circuit 46 engage the frame portions 89b.

A connector 10 is inserted into each of the pockets in the carrier 68 where a connection is to be made to the printed circuit board 69. The rearward portion 13 of the connector housing 11 fits generally complementarily between the two opposed rearward wall sections 74, while the forward portion 12 of the connector housing is confined between the forward transverse walls 71. The shoulder 14 between the forward housing portion 12 and the rearward housing portion 13 engages the shoulders 75 and 76 of the carrier 68 as well as the forward edge 90 of the longitudinal wall 77. This limits the travel of the connector 10 into the pocket in the carrier so that the connector 10 then has a predetermined position relative to the carrier. In that position the array of contact stripes 56 faces outwardly along the side of the carrier 68 adjacent the longitudinal base wall 70. The other array of contacts 59 of the flexible circuit 46 of the connector faces downwardly, as illustrated, adjacent the opposite side of the carrier.

The array of contacts 59 is aligned with one of the signal pad contact arrays 86 of the printed circuit board 69. Each of the contact dots 59 of the flexible circuit 46 bears against one of the contacts of the printed circuit board, as seen in FIG. 21. The grounding contact dots 60 of the flexible circuit engage the upper portion of the frame 89a of the ground conductor 89, which is exposed on one side of the printed circuit board 69. The pressure table 35 is biased toward the printed circuit board by the compression springs 44 to accomplish firm engagement and an electrical connection between the contacts of the flexible circuit 46 and those of the printed circuit board 69. The resilient pad 50 distributes the spring force so that an electrical connection is assured at each set of mating contacts.

The clamping bar 82 is tightened into position by the screws 81 only after the connectors 10 are positioned in the pockets in the carrier 68, to permit assembly without damaging the components. The separate clamping bar 82 enables the system to accommodate printed circuit boards of different thicknesses.

Figure 19:
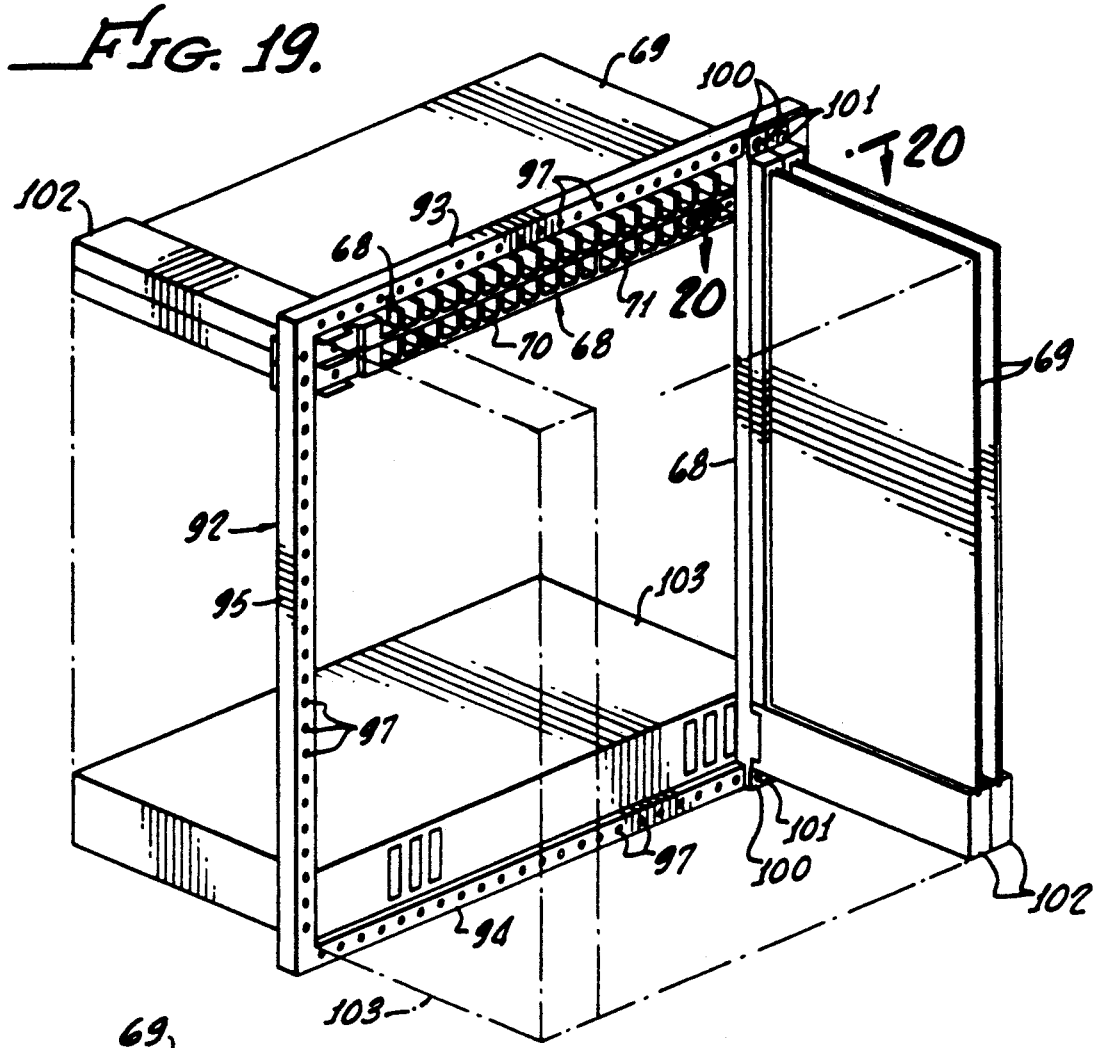
FIG. 19 is a perspective view of an arrangement for interconnecting a number of printed circuit boards by means of a midplane frame.
Figure 20:
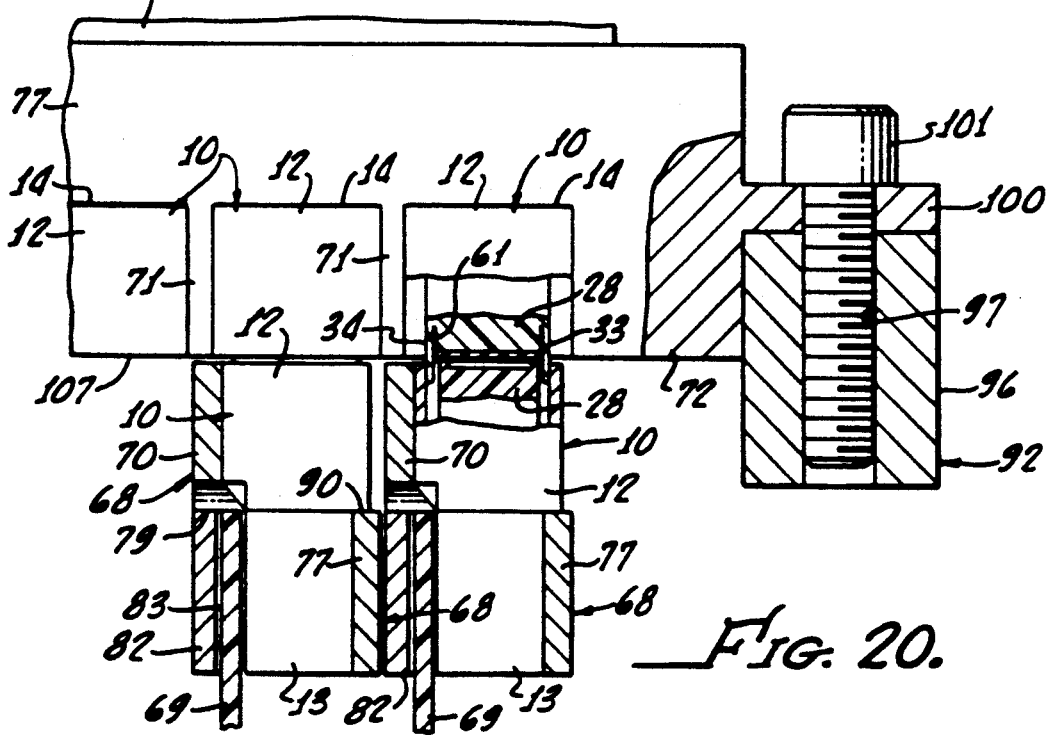
FIG. 20 is an enlarged fragmentary sectional view taken along line 20—20 of FIG. 19.
Figure 22:
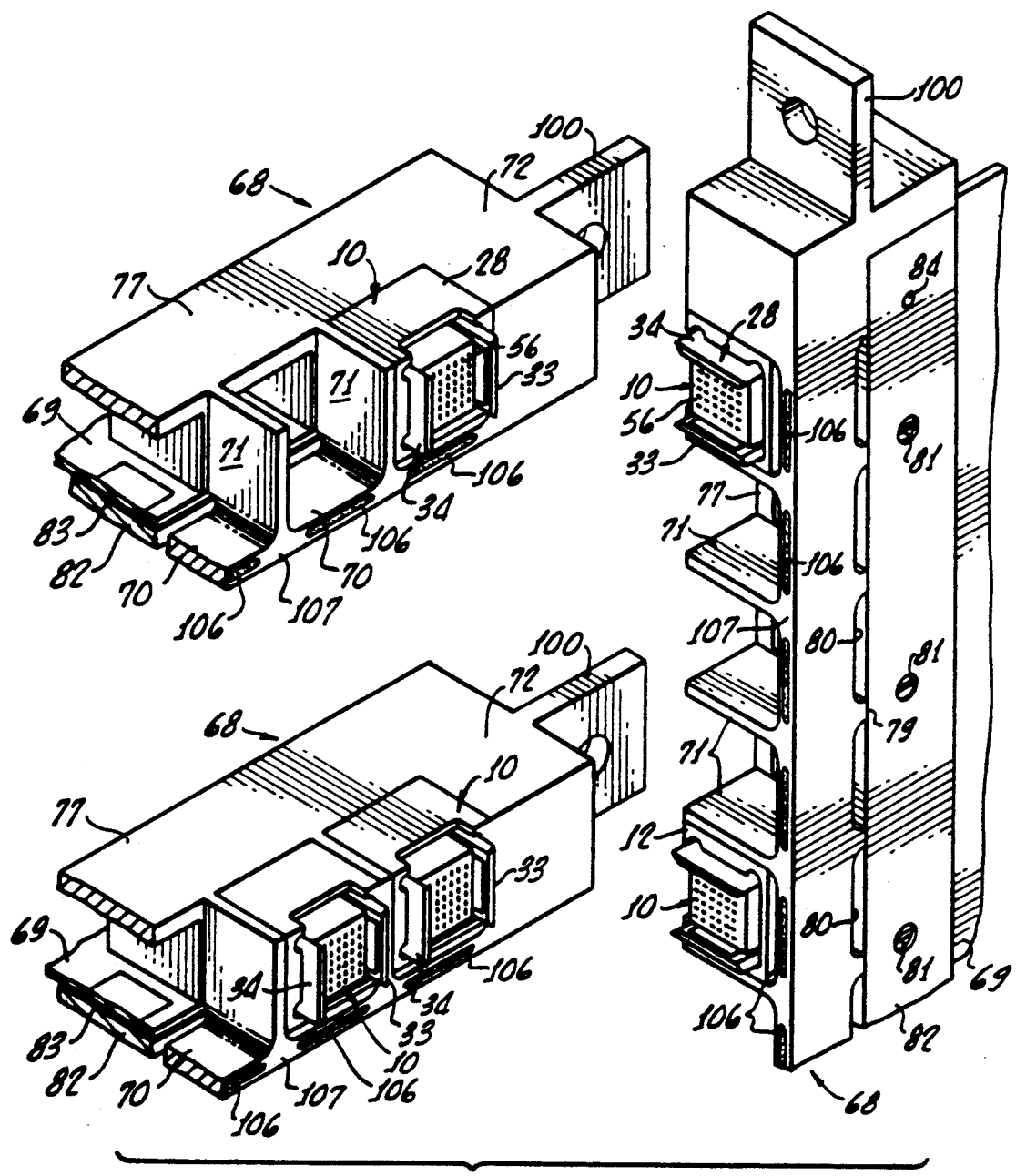
FIG. 22 is a fragmentary perspective view showing the relationship of the connectors and carriers when positioned by the midplane frame.

Connections among various printed circuit boards may be accomplished with the midplane connecting arrangement shown in FIGS. 19 and 20. In this arrangement there is a rectangular frame 92 which, as illustrated, includes parallel top and bottom rails 93 and 94 and side rails 95 and 96. A series of equally spaced threaded openings 97 is provided in the top rail 93 with similar openings formed in the bottom and side rails 94, 95 and 96.

Each of the carriers 68 is provided with an outwardly projecting flange 100 at either end of the carrier. One set of carriers 68, with printed circuit boards 69 attached, is secured to the top and bottom rails 93 and 94 by means of screws 101 that are received in the tapped openings 97. This results in a set of parallel printed circuit boards 69 which are positioned vertically, as the device is illustrated. A second set of printed circuit boards is attached to the side rails 95 and 96 by means of screws 101 that enter the threaded openings 97 of those rails. The result is a set of parallel printed circuit boards 69 which are in a horizontal alignment and are perpendicular to the other set of printed circuit boards.

Within the housing 102 along one edge of each circuit board, as shown in FIG. 19, are the power supply wire harnesses for the printed circuit board 69, which may be both electrical and optical. This connects to a power supply module 103.

This brings the forward faces of the connectors 10 of the intersecting printed circuit boards into engagement with each other. The stripe contacts 56 of the two flexible circuits 46 then overlap, one being at right angles to the other. The mating stripe contacts are in a cruciform relationship, as seen in FIGS. 24 and 25, and will make a good electrical connection irrespective of minor misalignments of the printed circuit boards. The grounding contact stripes 58 interengage in a similar manner. The floating mounting of the pressure table 28 of each of the connectors, together with the bias provided by the spring 30, assures that all mating contacts will be brought into firm engagement with each other. This also is facilitated by the resilient pads 47 which compensate for any surface irregularities. The arrangement of the frame 92 and associated printed circuit boards 69, with their carriers 68 and connectors 10, enables each printed circuit board in one orientation to be electrically connected to all the other printed circuit boards of the assembly which are at 90 degrees relative thereto.

As the two mating connectors 10 are brought together, their flanges 33 and 34 engage each other at their beveled side edges 104 and 105 to provide an encompassing square border. This also facilitates aligning each set of mating connectors as they are interengaged. The opposite beveled edges 104 and 105 converge slightly toward the outer ends of the flanges 33 and 34 which results in a wedging action at these edges of mating connectors 10.

When grounding clips 61 are provided for the connectors 10 the forwardly projecting flanges 64 and 65 of one grounding clip engage the square base frame of the other. An effective grounding shield is accomplished in this manner.

Additional or alternative grounding may be accomplished by a conductive gasket 106 positioned along the forward longitudinal edge 107 of the base wall 70 of the carrier 68 at each of the pockets for a connector 10. The gaskets 106 engage each other in a cruciform pattern when the two sets of carriers are attached to the frame 92. Only the gaskets of the carriers touch each other; the edges 107 of the carrier 68 do not.

The foregoing detailed description is to be clearly understood as given by way of illustration and example only, the spirit and scope of this invention being limited solely by the appended claims.

What is claimed is:

1. An electrical connector comprising
   a housing,
   a first pressure table carried by said housing and having an outer surface facing outwardly of said housing and positioned in a first plane,
   a first resilient means biasing said first pressure table outwardly with respect to said housing in a direction perpendicular to said first plane,
   a second pressure table carried by said housing and facing outwardly thereof,
   said second pressure table having an outer surface facing outwardly of said housing and positioned in a second plane substantially perpendicular to said first plane,
   a second resilient means biasing said second pressure table outwardly with respect to said housing in a direction perpendicular to said second plane,
   a flexible circuit having a plurality of first contacts in a first array adjacent one end portion thereof, a plurality of second contacts in a second array adjacent an opposite end portion thereof and a plurality of conductors interconnecting said contacts of said first and second arrays,
   said first array of contacts being positioned over said outer surface of said first pressure table,
   said second array of contacts extending over said outer surface of said second pressure table,
   whereby said second array of contacts can engage and make an electrical connection with an array of contacts on a printed circuit board and said first array of contacts can engage and make an electrical connection with the first array of contacts of an identical connector.

2. A device as recited in claim 1 in which said flexible circuit intermediate said end portions extends through said housing.

3. A device as recited in claim 1 including means for permitting limited floating movement of said first pressure table relative to said housing.

4. A device as recited in claim 1 including means for confining said second pressure table to rectilinear movement in said direction perpendicular to said first plane, and including means for permitting limited floating movement of said first pressure table relative to said housing.

5. A device as recited in claim 1 in which said outer surfaces of said pressure tables are substantially planar.

6. A device as recited in claim 1 in which said first resilient means includes a compression spring and said second resilient means includes a compression spring.

7. A device as recited in claim 1 including, in addition, a resilient pad on said outer surface of said first pressure table, said flexible circuit extending over said first resilient pad, and including a second resilient pad on said outer surface of said second pressure table, said flexible circuit extending over said second resilient pad, whereby said resilient pads can facilitate the engagement of said contacts of said first and second arrays of contacts with mating contacts.

8. A device as recited in claim 1 in which said flexible circuit intermediate said end portion includes a bend to provide an excess length of said flexible circuit to permit movement of said first and second pressure tables relative to said housing.

9. A device as recited in claim 1 in which said first pressure table includes two opposed parallel outwardly projecting flanges positioned on opposite sides of said flexible circuit for engaging similar flanges of an identical electrical connector positioned rotationally 90 degrees relative thereto for facilitating alignment of such electrical connectors.

10. A device as recited in claim 9 in which said flanges have beveled edges for engaging the beveled edges of flanges of an identical connector.

11. An electrical connector comprising
a housing having a forward portion and a rearward portion,
said forward portion having an open outer end facing in one direction;
said rearward portion having an opening therethrough facing in a second direction substantially perpendicular to said one direction,
a member in said housing having a forward portion in said forward portion of said housing and a rearward portion in said rearward portion of said housing,
said forward portion of said member having flange means thereon
means for retaining said member in a fixed position in said housing;
a first pressure table in said forward portion of said housing;
said first pressure table having flange means thereon,
resilient means biasing said first pressure table outwardly of said forward end of said housing,
said flange means of said member and said flange means of said pressure table being interengageable for limiting the outward movement of said first pressure table,
said first pressure table having freedom for limited floating movement relative to said member and to said housing,
a second pressure table received in said rearward portion of said housing adjacent said opening in said rearward portion of said housing,
resilient means biasing said second pressure table outwardly relative to said housing,
means for confining said second pressure table to a rectilinear path of movement relative to said housing, and
a flexible circuit having a first array of contacts at one end portion thereof, a second array of contacts at an opposite end portion thereof and conductors interconnecting contacts of said first and second arrays,
said first array being positioned over said first pressure table, said second array being positioned over said second pressure table, and an intermediate portion of said flexible circuit extending through said housing,
whereby said contacts of said second array can be brought into electrically conductive relationship with contacts of a printed circuit board and said contacts of said first array can be brought into electrically conductive relationship with contacts of an identical electrical connector positioned rotationally 90 degrees with respect thereto.

12. A device as recited in claim 11 including an electrically conductive member extending around said flexible circuit at said first array for providing a ground connection.

13. A device as recited in claim 11 in which said flange means of said member includes two forwardly projecting L-shaped arms, and said flange means of said first pressure table includes a rearward flange overlapped by the end portions of said L-shaped arms.

14. A device as recited in claim 11 in which said electrically conductive member includes outwardly projecting tabs for making contact with such an electrically conductive member of an identical connector.

15. A device as recited in claim 14 in which said first pressure table includes opposite outwardly projecting flanges having side edges engageable with the said edges of the outwardly projecting flanges of an identical electrical connector.

* * * * *